United States Patent [19]
Nishiuma et al.

[11] Patent Number: 5,225,709
[45] Date of Patent: Jul. 6, 1993

[54] PACKAGE HAVING A STRUCTURE FOR STABILIZING AND/OR IMPEDANCE-MATCHING A SEMICONDUCTOR IC DEVICE ACCOMMODATED THEREIN

[75] Inventors: Masahiko Nishiuma, Fussa; Chiyoshi Kamada, Kokubunji, both of Japan

[73] Assignees: Hitachi, Ltd., Tokyo; Hitachi VLSI Engineering Corporation, Kodaira, both of Japan

[21] Appl. No.: 715,068

[22] Filed: Jun. 13, 1991

[30] Foreign Application Priority Data

Jun. 15, 1990 [JP] Japan .................................. 2-155228

[51] Int. Cl.⁵ ............................................. H01L 23/02
[52] U.S. Cl. .................................... 257/700; 257/692
[58] Field of Search ................... 357/70, 74, 68; 257/700, 692, 690, 691

[56] References Cited

U.S. PATENT DOCUMENTS

| | | | |
|---|---|---|---|
| 4,922,324 | 5/1990 | Sudo | 357/70 |
| 4,972,253 | 11/1990 | Palino et al. | 357/70 |
| 5,043,794 | 8/1991 | Tai et al. | 357/74 |

FOREIGN PATENT DOCUMENTS

| | | |
|---|---|---|
| 57-107059 | 7/1982 | Japan . |
| 63-228723 | 9/1988 | Japan . |
| 2-72654 | 3/1990 | Japan . |

OTHER PUBLICATIONS

High Density Packaging Technology Handbook, pp. 352-353, Science-forum Co., Ltd., Mar. 15, 1986.

Primary Examiner—Rolf Hille
Assistant Examiner—Roy Potter
Attorney, Agent, or Firm—Pennie & Edmonds

[57] ABSTRACT

A packaged semiconductor device has a package, a semiconductor IC chip disposed in a space formed in the package, a strip conductor buried at a first level in the package for carrying a signal to be coupled to the IC chip, a first reference potential conductor buried at a second level in the package for providing a reference potential for the IC chip and a second reference potential conductor buried at the first level in the package for shielding the strip conductor. A connection conductor such as a bonding wire is provided across the second reference potential conductor for connecting the IC chip with one of the ends of the strip conductor. A dielectric material is provided between the connection conductor and the second reference potential conductor to provide the connection conductor with a characteristic impedance matched with an impedance of a source of the signal the connection conductor carries. The package may have an interconnecting conductor extending to electrically connect the first and second reference potential conductors.

10 Claims, 21 Drawing Sheets

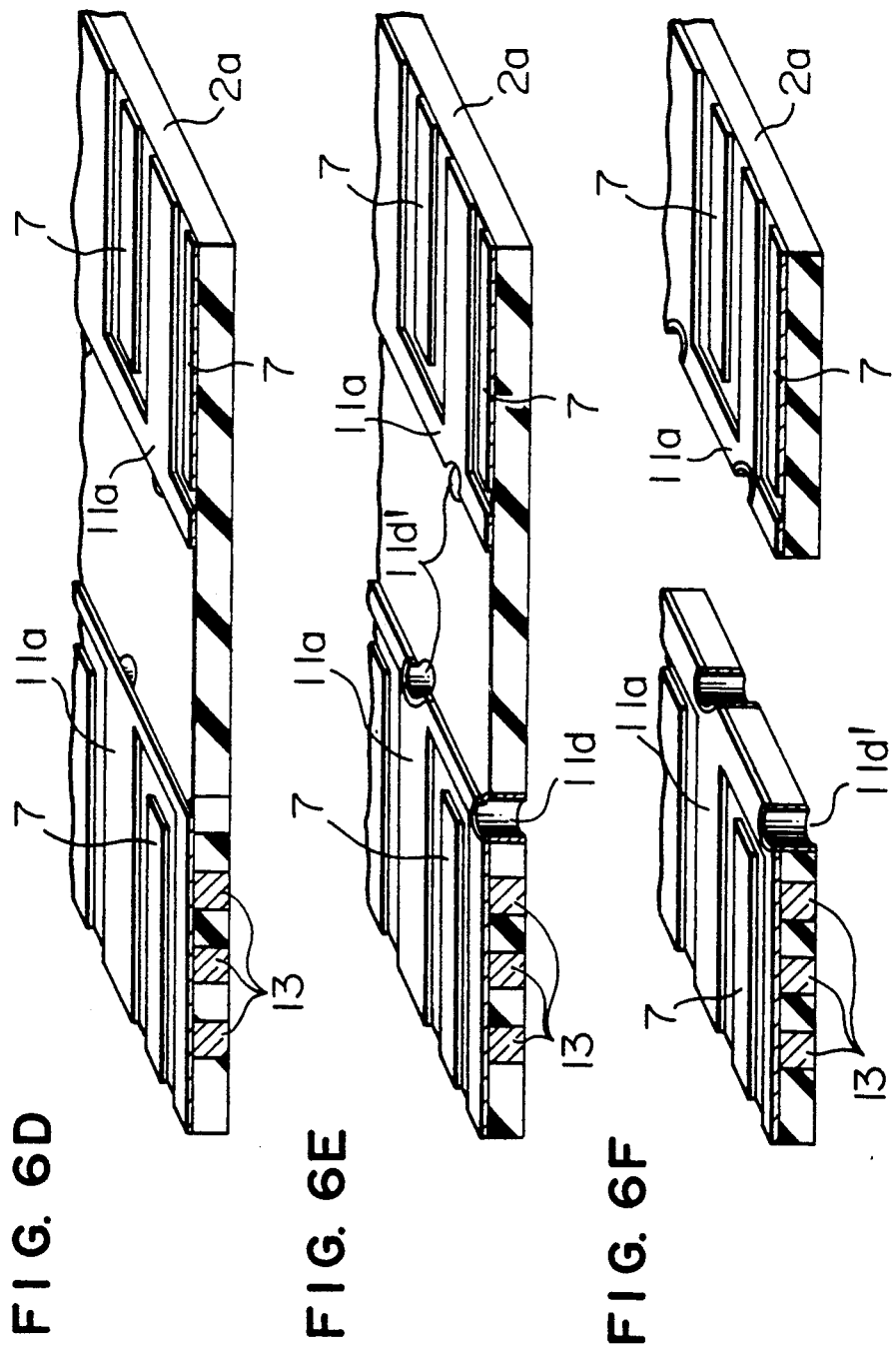

PACKAGE HAVING A STRUCTURE FOR STABILIZING AND/OR IMPEDANCE-MATCHING A SEMICONDUCTOR IC DEVICE ACCOMMODATED THEREIN

BACKGROUND OF THE INVENTION

This invention relates to a semiconductor integrated circuit device (IC device), and more particularly to a package for a very high speed IC device.

In very high speed IC devices operating at a high frequency of a G Hz band such as a GaAs (gallium arsenide) IC device, a characteristic impedance of a signal transmission line for connecting electrically the IC device to another device must be matched with an impedance of a source of the signal carried by the signal transmission line. For, if the characteristic impedance of the signal transmission line carrying the high frequency signal does not match with the impedance of the source of the signal, a transmission loss such as reflection of the signal and distortion of a waveform occurs and a normal operation of the IC device is impeded. Therefore, a package accommodating therein a very high speed IC device is designed so that the value of the characteristic impedance of the signal line inside the package is in match with the value of the impedance of the signal source. As to an IC package for a very high speed IC device, refer to Japanese literature "HIGH DENSITY PACKAGING TECHNOLOGY HANDBOOK", published by Science-Forum Co., Ltd. (Mar. 15, 1986), pp. 352-353.

However, most of the conventional packages for very high speed IC devices do not consider sufficiently impedance matching of a bonding wire for connecting the signal line inside the package and the IC device or in other words, a semiconductor chip. For this reason, the transmission loss of the signal resulting from mismatching of the impedance of the bonding wire cannot be neglected as the operating frequency of the device becomes higher.

One of the semiconductor devices accommodating therein a semiconductor chip for handling a high frequency signal, which is disclosed in JP-A-63-22873 (laid-open on Sep. 22, 1988) has a coplanar structure in which ground lines are disposed, on the same plane, on both sides of one signal line both on a semiconductor chip and on a package so as to provide a desired characteristic impedance and bonding wires for connecting electrically the signal lines of the semiconductor chip and package with one another and those for connecting electrically ground lines of the semiconductor chip and package with one another are integrally fixed by a holding member of a dielectric material so as to keep constant the mutual gap and to provide the bonding wires with the same characteristic impedance as that of the signal line of the semiconductor chip and package.

JP-A-2-72654 (laid-open on Mar. 12, 1990) teaches provision of specific ones of the terminals of a package extending along the inner wall of a frame member defining a space for accommodating an IC chip and to connect it electrically to a stage of a metal on which the IC chip is placed inside the space in order to suppress cross-talk in the IC package.

JP-A-57-107059 (laid-open on Jul. 3, 1982) teaches to dispose ground conductors for surrounding the entire surface of an IC chip inclusive of its bottom and sides inside a package for accommodating the IC chip and thus to stabilize the operation of the IC chip against noise.

SUMMARY OF THE INVENTION

According to one aspect of the present invention, a packaged semiconductor device has a package, a semiconductor IC chip disposed in a space formed in the package, a strip conductor buried at a first level in the package for carrying a signal to be coupled to the IC chip, a first reference potential conductor pattern buried at a second level in the package for providing a reference potential for the IC chip, a second reference potential conductor pattern buried at the first level in the package for shielding the strip conductor, and a connection conductor provided across the second reference potential conductor for connecting the IC chip with one of the ends of the strip conductor, in which a dielectric material is provided between the connection conductor and the second reference potential conductor pattern to provide the connection conductor with a characteristic impedance matched with an impedance of a source of the signal the connection conductor carries.

According to another aspect of the present invention, the package may have an interconnecting conductor extending to electrically connect the first and second reference potential conductor patterns.

According to another aspect of the present invention, the second reference potential conductor is substantially U-shaped, the connection conductor is constituted by a bonding wire and part of the second reference potential conductor is disposed in the proximity of the bonding wire so that the bonding wire extends across that part of the second reference potential conductor.

The value of the characteristic impedance of the connection conductor can be substantially matched with the value of the characteristic impedance of the strip conductor by selecting appropriately the distance between the second reference potential conductor and the connector conductor and/or the dielectric constant of the dielectric material spacing them from each other.

BRIEF DESCRIPTION OF THE DRAWINGS

FIGS. 3H' and 3J' are partial enlarged views of the semiconductor integrated circuit device at the fabrication stages shown in FIGS. 3H and 3J, respectively.

FIGS. 6A to 6M are sectional views showing stepwise a packaged semiconductor integrated circuit device in accordance with still another embodiment of the present invention.

FIGS. 6H', 6J', 6L' and 6M' are partial enlarged views of the device at the fabrication stages shown in FIGS. 6H, 6J, 6L and 6M, respectively.

DESCRIPTION OF THE PREFERRED EMBODIMENTS

Figure 1:
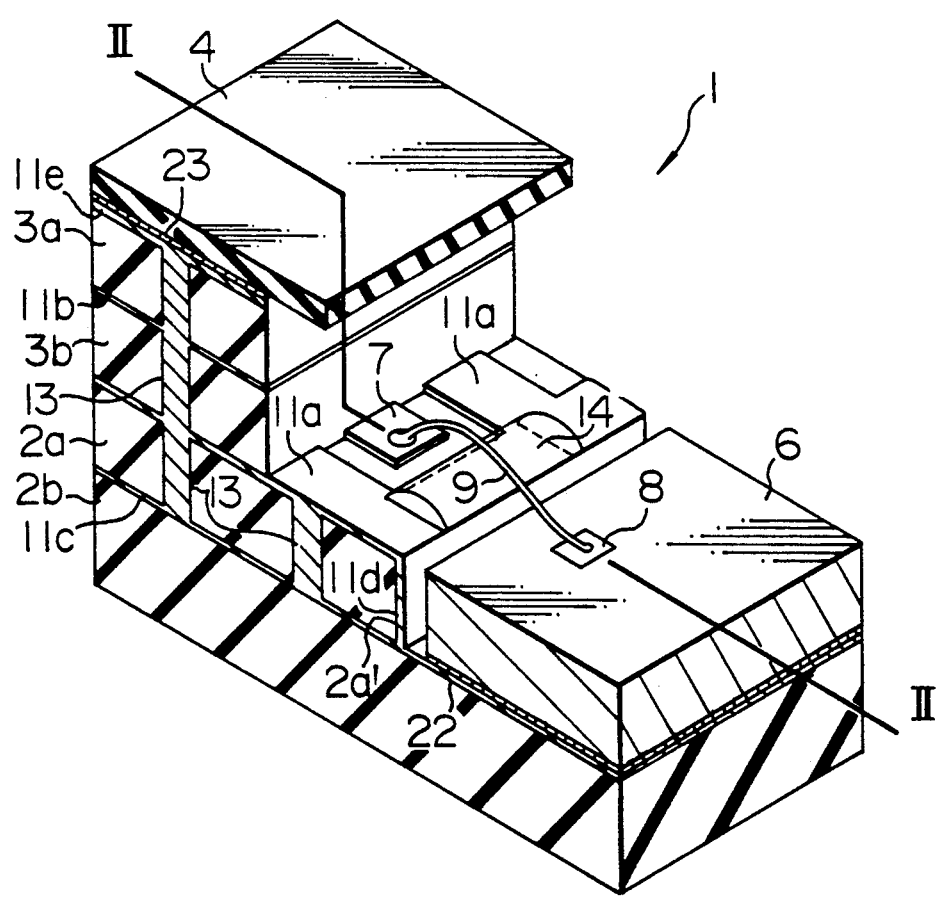
FIG. 1 is an exploded perspective view of the principal portions of a packaged semiconductor integrated circuit device in accordance with an embodiment of the present invention.

A packaged semiconductor IC device in accordance with an embodiment of the present invention will be explained with reference to FIGS. 1 and 2. FIG. 1 is an exploded perspective view of the principal portions of this IC device and FIG. 2 is a sectional view taken along line II—II of FIG. 1.

A package 1 is a ceramic package, for example. A GaAs chip 6 equipped with a plurality of logic ICs for executing a switching operation at a very high speed is accommodated in the space 5 which is defined by a base plate 2b (made of alumina, for example), a support plate 2a (made of alumina, for example), a frame member 3b (made of alumina, for example) and a cap structure having a layer 3a (made of alumina, for example) and a layer 4 (made of Fe-42% Ni alloy and plated with Au, for example).

Hereinafter, the structure of this package will be described in further detail.

Figure 2:
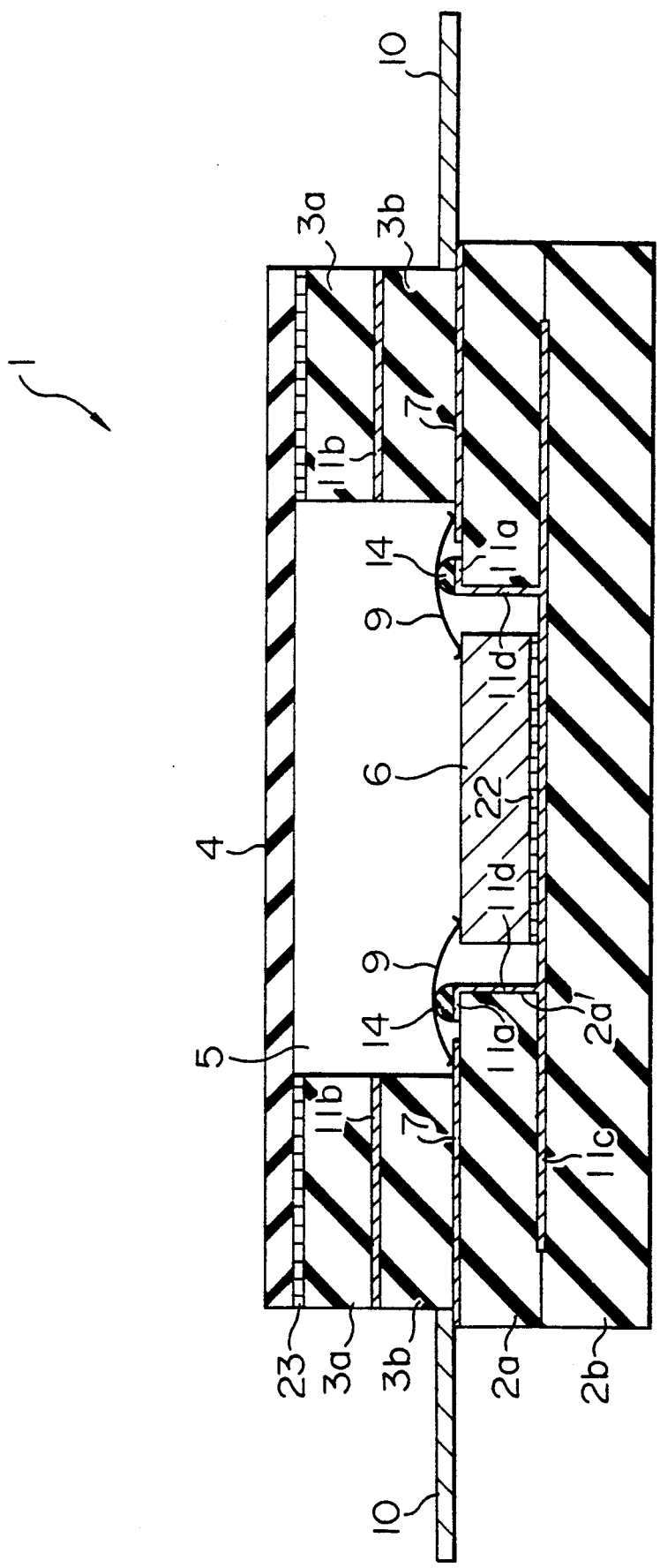
FIG. 2 is a sectional view of the semiconductor integrated circuit device taken along line II—II of FIG. 1.

As shown in FIGS. 1 and 2, the semiconductor IC chip 6 is supported on the base plate 2b through a first reference potential conductor pattern (first metallized layer) 11c which is formed on the base plate 2b. The IC chip 6 is bonded to the first metallized layer 11c by a brazing material such as an Au-Sn alloy, or the like. The first metallized layer 11c serves to provide a reference potential (e.g. ground potential) for the IC chip 6. The support plate 2a made of a dielectric material is formed in such a manner as to cover partially the base plate 2b and the first metallized layer 11c. This support plate 2a is equipped with a side surface 2a' which contributes to definition of the space 5 for the IC chip 6 on the base plate 2b.

A strip conductor 7 made of, for example, W for carrying a signal (e.g., a high frequency signal of 2.4-10 GHz) coupled to the IC chip 6 is formed on the support plate 2a. This strip conductor 7 has a first end exposed to the space 5 and opposed to the IC chip 6 and has a second end exposed outside the package for connection with an external lead 10 made of an alloy containing Fe such as Fe-42% Ni alloy (42-alloy). A second reference potential conductor pattern (second metallized layer) 11a is formed on the support plate 2a. The second metallized layer 11a is substantially U-shaped, for example, in such a manner as to sandwich the strip conductor 7 and so as to be insulated from the conductor 7, and extends in such a manner as to reach the side surface 2a' of the first support plate 2a. The first end of the strip conductor 7 is surrounded by this second metallized layer 11a. A connection conductor (e.g. bonding wire of Au) 9 which extends across the second metallized layer 11a inside the space 5 is connected at its first and second ends to the first end of the strip conductor 7 and to the IC chip 6, respectively.

A dielectric material member 14 made of, for example, a polyimide resin is disposed at least between the bonding wire 9 and the second metallized layer 11a in order to provide the bonding wire 9 with a characteristic impedance (e.g. 50 Ω) which is in match with the impedance of the signal source described already.

An interconnecting conductor (fourth metallized layer) 11d is formed on the side surfaces 2a' of the support plate 2a so as to connect electrically the first and second metallized layers 11c and 11a with each other. The function of the fourth metallized layer 11d will be described later.

The frame member 3b made of a dielectric material is formed in such a manner as to cover partially the support plate 2a, the second metallized layer 11a and the strip conductor 7 and to contribute to definition of the space 5 for the IC chip.

A third reference potential conductor pattern (third metallized layer) 11b is formed on the frame member 3b. The first, second and third metallized layers 11c, 11a and 11b are connected electrically to one another by through-hole conductors 13 made of, for example, tungsten (W) which are bored through the support plate 2a, the base plate 2b and the frame member 3b. The first and third metallized layers 11c, 11b are disposed in such a manner as to interpose the strip conductor 7 between them in the direction of the thickness of the base plate 2b and according to this arrangement, the first, second and third metallized layers 11c, 11a, 11b surround and shield the strip conductor 7 while interposing the dielectric material member of the first and second support plates 2a, 3b between them, and provide the characteristic impedance, which is in match with the impedance of the signal source described already, to the strip conductor. The metallized layers 11c, 11a, 11b and 11e are formed by thick film printing of tungsten, for example. The metallized layer 11d may be made of a material similar to those of the layers 11a-11c and 11e. The metallized layers 11a-11e may be subjected to Ni-plating and further to Au-plating.

In order to define the space 5 for the IC chip 6 in cooperation with the base plate 2b, the support plate 2a and the frame member 3b, cap structure 3a, 4 are formed on the frame member 3b and the third metallized layer 11b through a fifth metallized layer 11e and a brazing material 22 in such a manner as to extend above the base plate 2b. Preferably, the through-hole conductor 13 is connected electrically to the fifth metallized layer while penetrating through the layer 3a (made of alumina, for example) of the cap structure as shown in the drawings.

As described above, the second metallized layer 11a disposed on the upper surface of the support plate 2a is disposed in such a manner as to surround the first end of the strip conductor 7. In other words, the second metallized layer 11a is disposed so that part of it is in the proximity of the bonding wire 9.

An induction potential may be excited in the second metallized layer 11a near the bonding wire 9 by the high frequency electric signal carried by the bonding wire 9 and hence, the potential of the first or third metallized layer 11b or 11c connected with the second metallized layer 11a may be unstable, so that noise is generated indirectly in other strip lines or in other bonding wires and an erroneous operation of the IC device may be invited.

In order to keep the induction potential of this second metallized layer 11a low and to eventually prevent the erroneous operation of the IC chip 6, a self-inductance of each of the strip conductor 7 and the bonding wire 9 and mutual inductance between both of them and the metallized layers 11a, 11b, 11c must be minimized. To this end, the metallized layer 11a and the metallized layers 11b, 11c disposed above and under the metallized layer 11a are mutually connected by the through-hole conductor 13 and at the same time, the tip portion of the metallized layer 11a, which is in the proximity of the bonding wire 9 and is exposed to the space 5, is connected to the metallized layer 11c through the metallized layer 11d as described above. Accordingly, the metallized layer 11a, being connected as described above and having a relatively large cross-sectional area (e.g. about 300 μm wide and 20 μm thick) as compared with a wire (e.g. usually having a diameter of about 25-30 μm), exhibits substantially a low impedance to the high frequency signal than grounded wires.

As described above, the dielectric material member 14 made of a polyimide resin, for example, is interposed between the second metallized layer 11a and the bonding wire 9. The dielectric material member 14 is disposed so that its thickness is in agreement with the loop height of the bonding wire 9 and hence, the dielectric material member 14 comes into contact with the metallized layer 11a and with the bonding wire 9. Accordingly, it serves to keep constant the distance between the bonding wire 9 and the metallized layer 11a. The dielectric material member 14 also serves to prevent short-circuit between the metallized layer 11a and the bonding wire 9.

As described above, in the IC package 1 of this embodiment, the metallized layer 11a is disposed in the proximity of the bonding wire 9 and the dielectric material member 14 is interposed between them. Accordingly, it is possible to bring the value of the characteristic impedance of the bonding wire 9 into conformity with the value of the characteristic impedance (e.g. 50 Ω) of the strip conductor 7 by adjusting the thickness of the dielectric material member 14 (that is, the distance between the metallized layer 11a and the bonding wire 9) and(or) by selecting appropriately the material of the dielectric material member (that is, its dielectric constant). Since reflection of the signal and distortion of the waveform inside the IC package 1 can thus be avoided, the high frequency signal can be transmitted without any loss.

Next, a packaged semiconductor IC device packaged in accordance with one embodiment of the present invention and its fabrication process will be explained with reference to FIGS. 3A-3M, 3H' and 3J'.

Figure 3A:
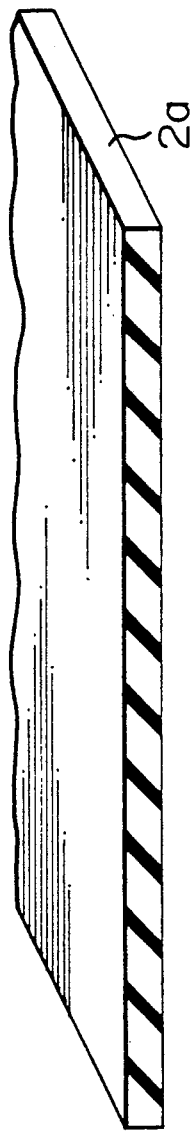
FIGS. 3A to 3M are sectional views showing stepwise the fabrication steps of a packaged semiconductor integrated circuit device in accordance with another embodiment of the present invention.
Figure 3B:
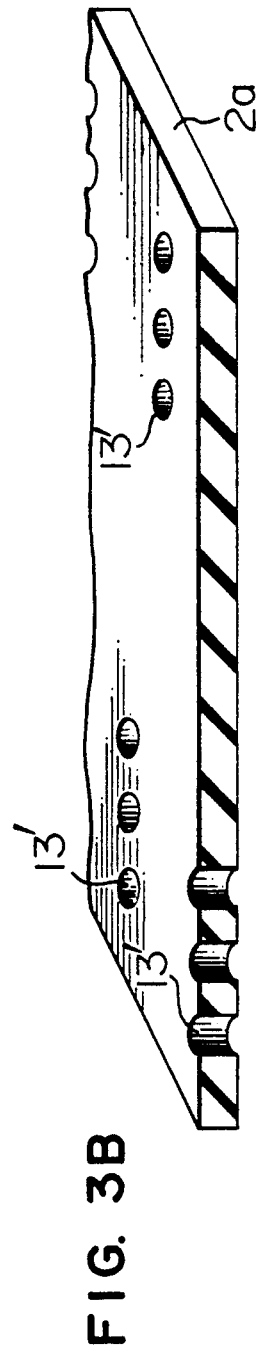
Figure 3C:
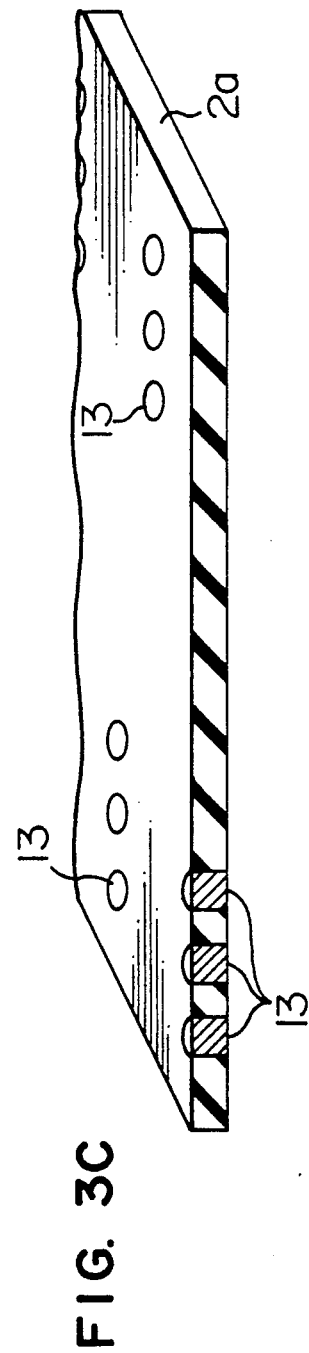

To begin with, the through-holes 13' are formed by punching at predetermined positions of an unbaked ceramic sheet 2a shown in FIG. 3A (FIG. 3B). Metallization ink such as tungsten ink are charged into the through-holes 13' by screen printing using a screen printing mask having holes therein that correspond to these through-holes 13', forming thereby electrically conductive through-holes or through hole conductors 13 (FIG. 3C).

Figure 3D:
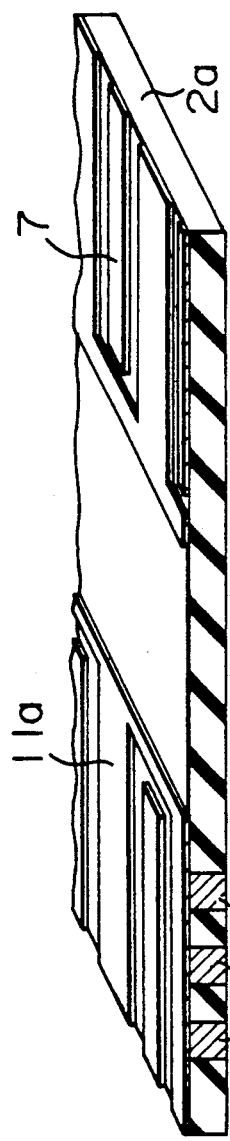

Next, a plurality of strip conductors 7 and a plurality of substantially U-shaped second reference potential conductor patterns (the second metallized layers) 11a are formed by similar printing method (FIG. 3D).

Figure 3E:
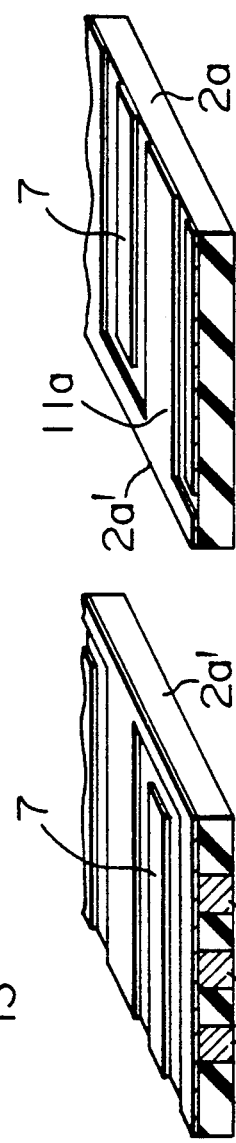

After the strip conductors 7 and the second metallized layers 11a are thus formed on the surface, the unbaked ceramic sheet 2a is cut in registration with the inner end surface of the U-shaped metallized layer 11a. In this manner, two structures are obtained. A space corresponding to the space 5 for accommodating the IC chip 6 is set between both structures, and both structures are then positioned (FIG. 3E).

Figure 3F:
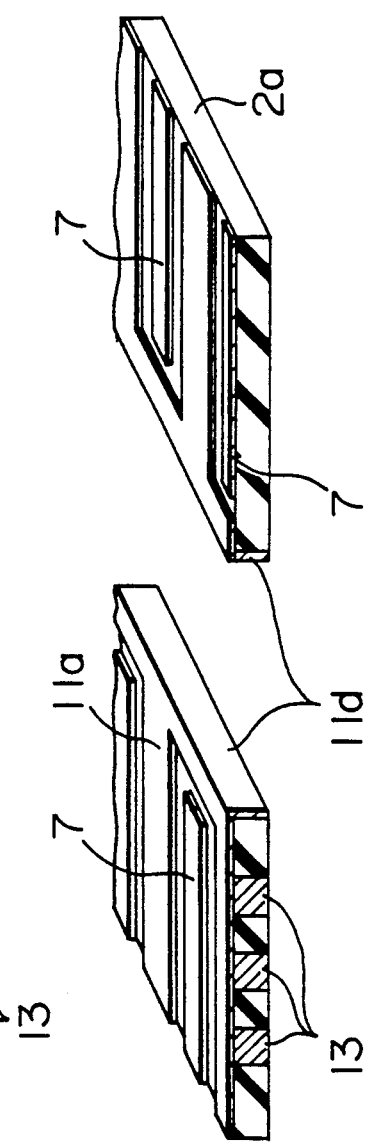

Next, tungsten ink is coated on the cut surfaces of both structures or in other words, on the cut surfaces 2a' of the ceramic sheet 2a, by a roller, for example, so as to form a side surface metallized layer or in other words, the interconnecting conductors 11d (FIG. 3F).

Figure 3G:
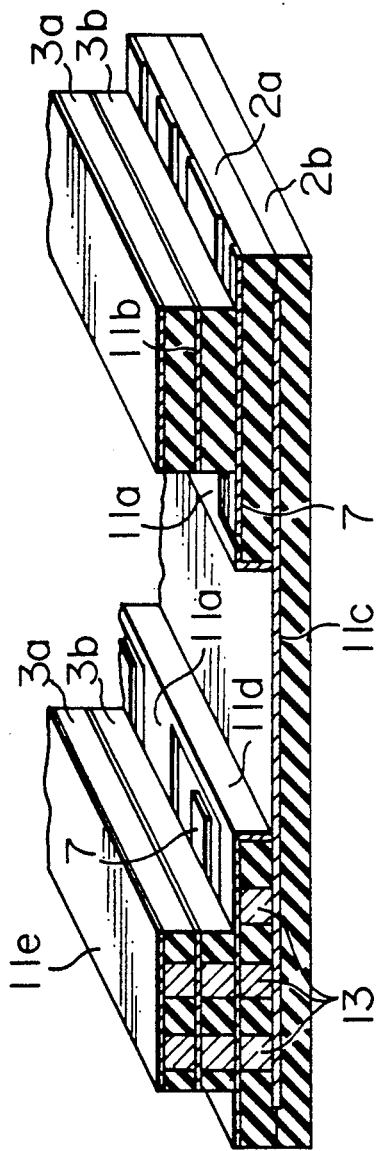

The base plate 2a and the frame member 3b each having a plurality of through-holes and a plurality of metallized layers (11c, 11b, 11e) that are formed on an unbaked ceramic sheet by the similar process, and part 3a of the cap structure, are laminated in the manner as shown in FIG. 3G and the resulting laminate member is baked (FIG. 3G).

Figure 3H:
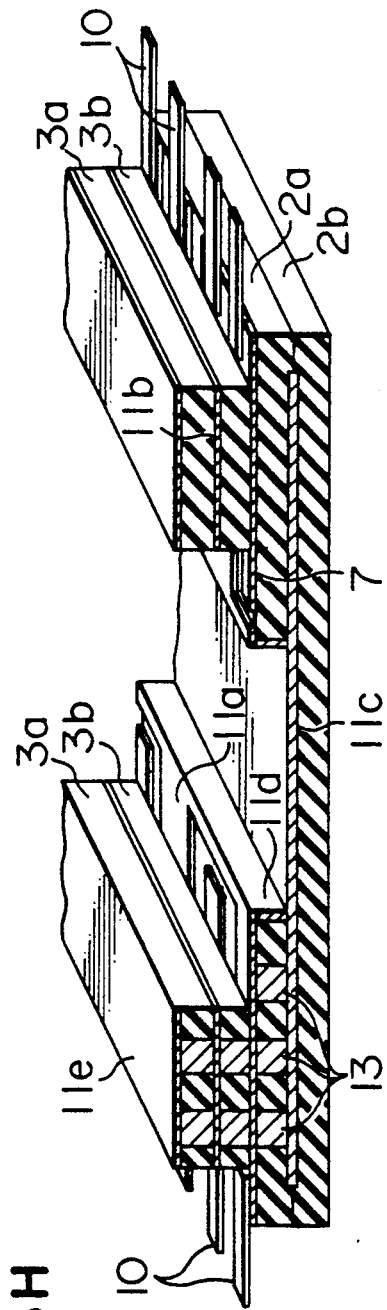

Next, foundation plating such as electroplating of Ni is applied to the surface of each of the exposed metallized layers and the external lead 10 (e.g. 42-alloy, Fe-42%Ni alloy) is fused to the strip conductors 7 and to the metallized layers using a brazing material such as a silver solder (Ag-Cu), or the like, and the exposed portions of the metallized layers and the external leads 10 are finish-plated by Au plating, for example, (FIG. 3H). FIG. 3H' shows in enlargement the part of the device at this fabrication stage.

Figure 3I:
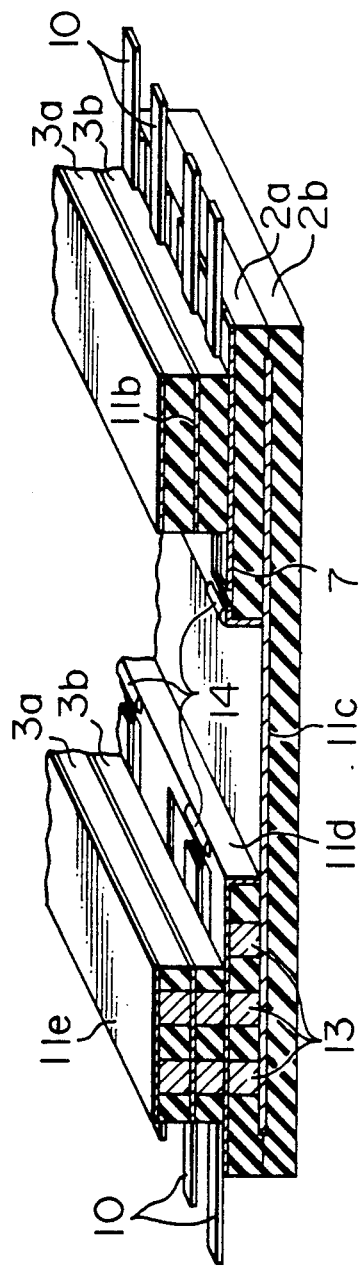

To form the dielectric material member 14, a polyimide resin, for example, is coated or potted onto the portions of the metallized layers 11a exposed to the space and is shaped in a desired shape (FIG. 3I).

Figure 3J:
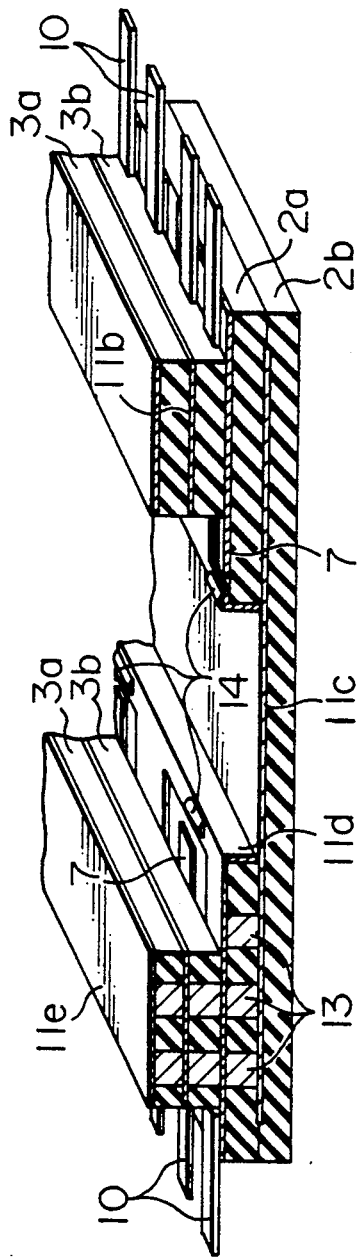

If the dielectric material member 14 is an uncured resin such as a varnish, the resin is baked, cured and shaped (FIG. 3J). FIG. 3J' shows in enlargement the part of the device at this fabrication stage.

Figure 3K:
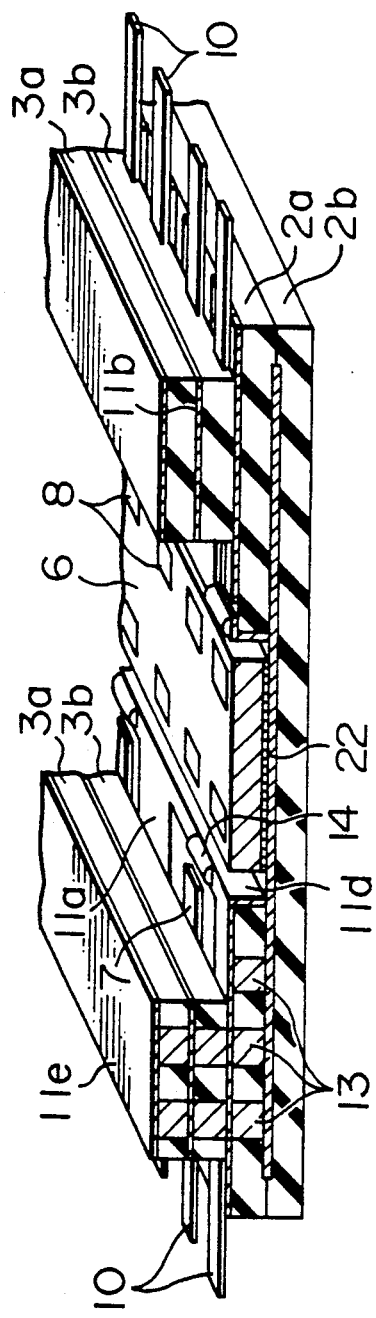

Next, the IC chip 6 is die-bonded onto the metallized layer 11c inside the space 5 using an Au - 20% Sn brazing material 22, for example (FIG. 3K).

Figure 3L:
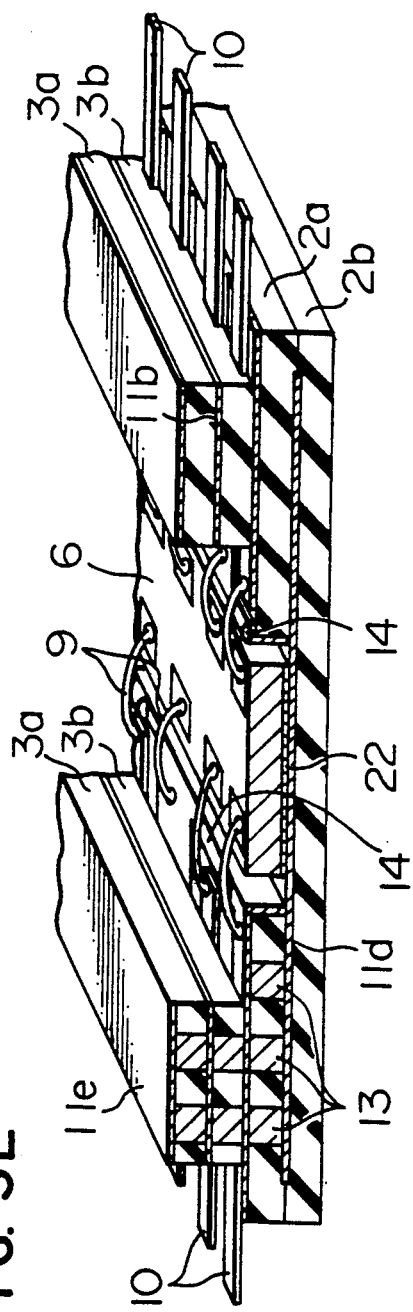

The bonding pads 8 of the IC chip 6 and the strip conductors 7 are disposed in such a manner as to step over the dielectric material member 14 and are connected electrically to one another using the connection conductors of an Au wire (bonding wires 9), for example. In this instance, the loop (shape) of each bonding wire 9 is adjusted so that the bonding wire 9 and the dielectric material member 14 come into contact with each other. Similarly, the bonding wire 9 of the Au wire is used for the connection between each bonding pad that provides a reference potential and the reference potential conductor pattern (metallized layer) 11a but the dielectric material member is not disposed for these bonding wires (FIG. 3L).

Figure 3M:
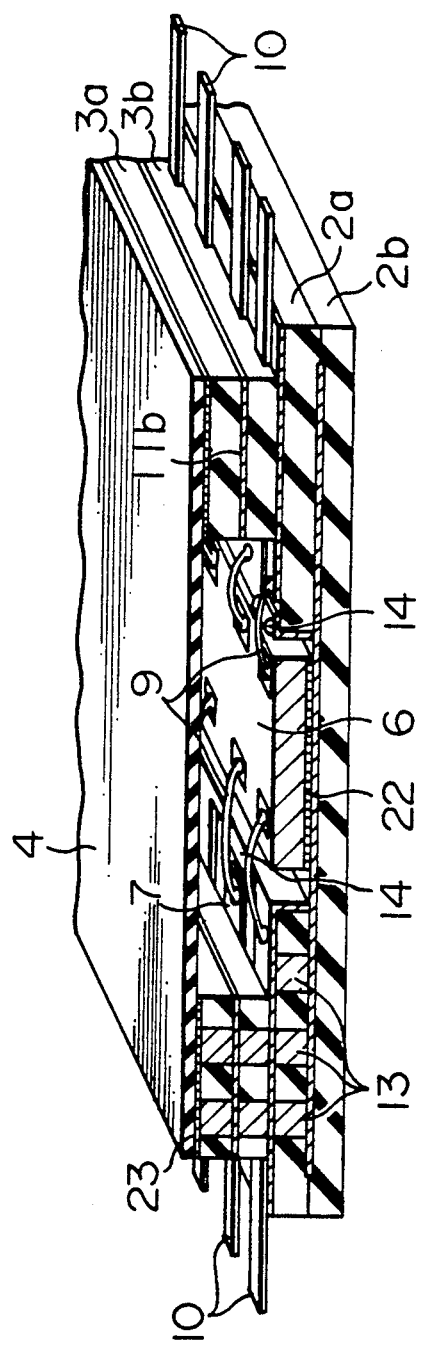
Figure 3H:
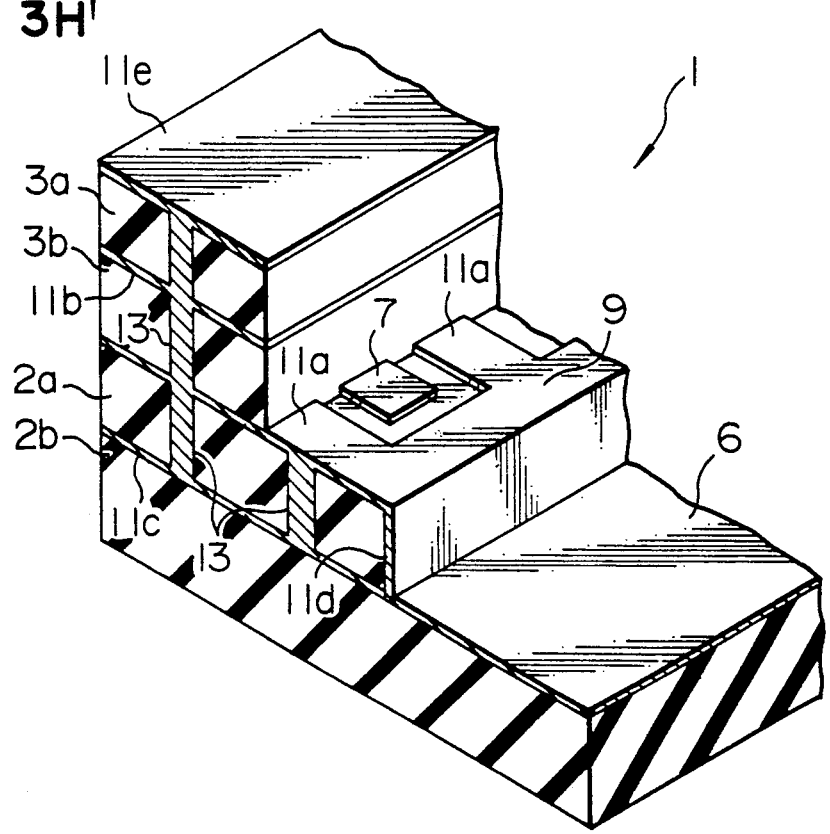
Figure 3J:
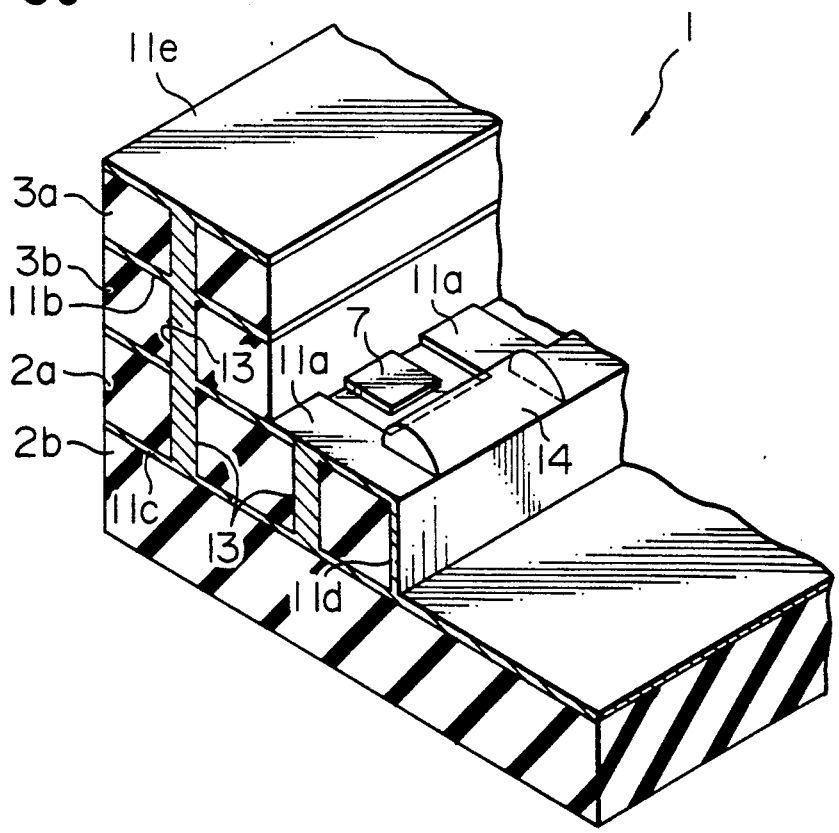

Next, the cap 4 made of the 42-alloy, for example, is bonded to the metallized layer 11e using an Au-20%Sn brazing material 23 (FIG. 1), for example (FIG. 3M).

Figure 4A:
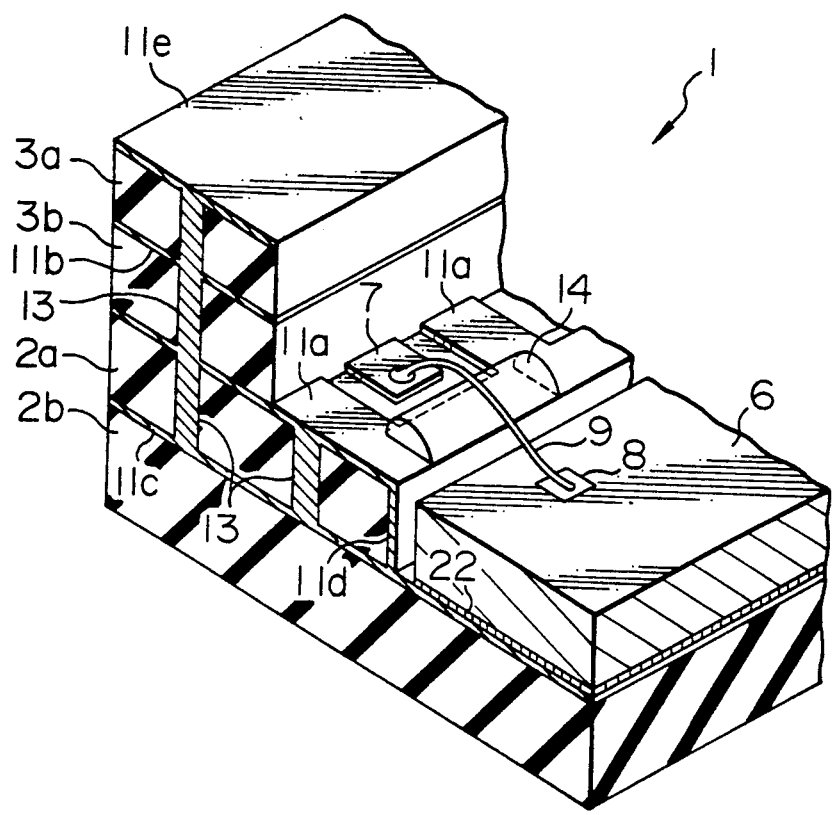
FIGS. 4A to 4C are sectional views showing stepwise the fabrication steps of a packaged semiconductor device in accordance with still another embodiment of the present invention.

Next, the packaged semiconductor IC device in accordance with another embodiment of the present invention and its fabrication process will be explained with reference to FIGS. 4A through 4C.

In the structures obtained through the same fabrication process as those shown in FIGS. 3A-3I, the bonding pads 8 and the strip conductors 7 are connected electrically by the connection conductor of the Au wire (bonding wire) 9, for example, in such a manner as to step over the dielectric material member 14. In this instance, the loop (shape) of the bonding wire 9 is adjusted so that the bonding wire 9 and the dielectric material member 14 come into contact with each other and by so doing, the distance between the bonding wire 9 and the second reference potential conductor pattern (second metallized layer) 11a positioned below the bonding wire 9 is determined by the height of the dielectric material member 14 (FIG. 4A).

Figure 4B:
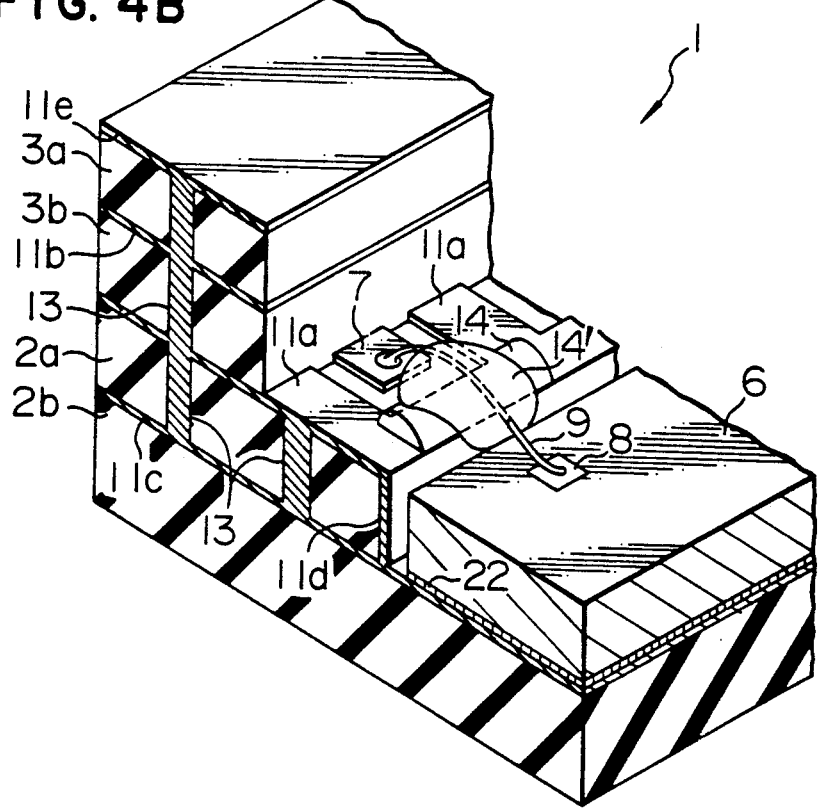

Next, the portion of the bonding wire 9 that steps over the second metallized layer is covered substantially with a dielectric material member 14' made of the same material as the dielectric material member 14, by potting, for example (FIG. 4B).

Figure 4C:
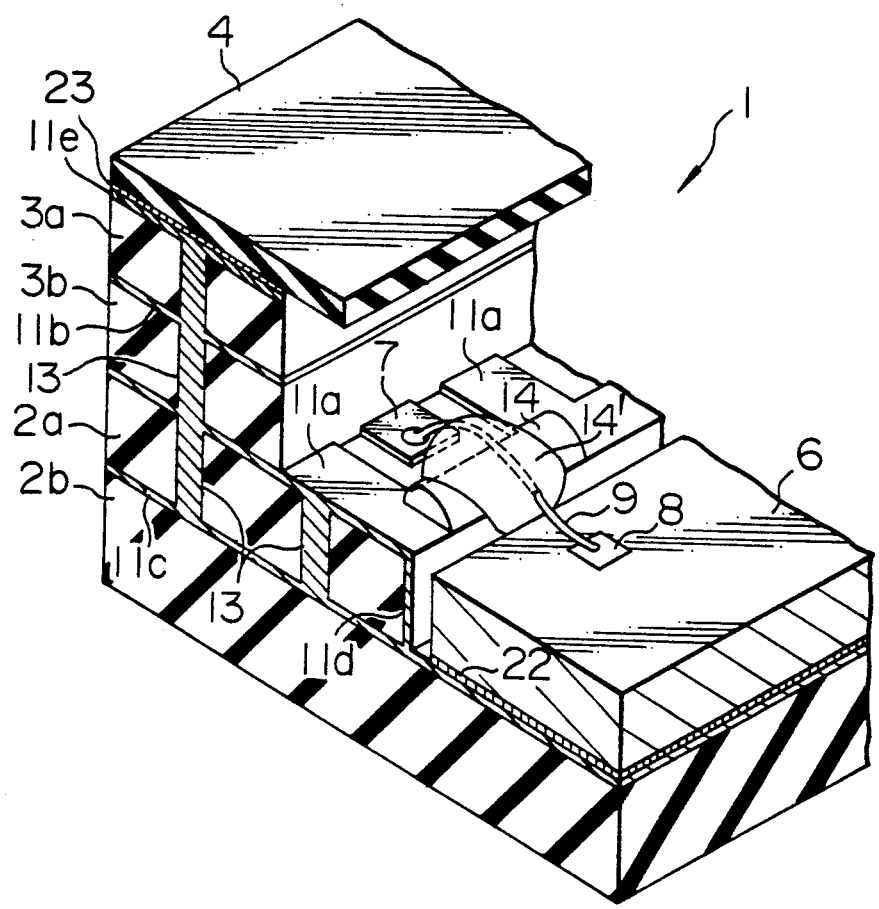

The cap 4 made of the 42-alloy (Fe - 42%Ni), for example, is bonded to the metallized layer 11e using an Au - 20%Sn brazing material, for example (FIG. 4C).

Figure 4D:
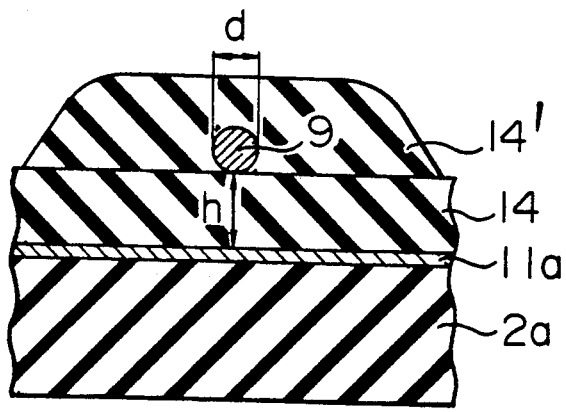
FIG. 4D is an explanatory view useful for explaining a characteristic impedance of a connection conductor in the semiconductor integrated circuit device shown in FIGS. 1 and 3M.

The arrangement of the bonding wire 9 and the members surrounding the bonding wire 9 in the embodiment shown in FIG. 4C is shown in section in FIG. 4D and the characteristic impedance Zo of the bonding wire 9 is approximated by the following formula:

$$Zo = \frac{60}{\sqrt{\epsilon_r}} \cdot \ln \frac{4h}{d} \quad (1)$$

where
- $\epsilon_r$: dielectric constant of dielectric material members 14, 14',
- d: diameter of bonding wire 9,
- h: distance between second metallized layer 11a and bonding wire 9.

Accordingly, it can be understood that the characteristic impedance Zo of the bonding wire 9 can be adjusted to a desired value by adjusting at least one of $\epsilon_r$, d and h.

It is obvious that the characteristic impedance of the bonding wires 9 in the embodiments shown in FIGS. 1 and 3M, too, can be determined from the formula (1) given above.

The packaged semiconductor IC device in accordance with still another embodiment of the present invention and its fabrication process will be explained with reference to FIGS. 5A through 5C.

Figure 5A:
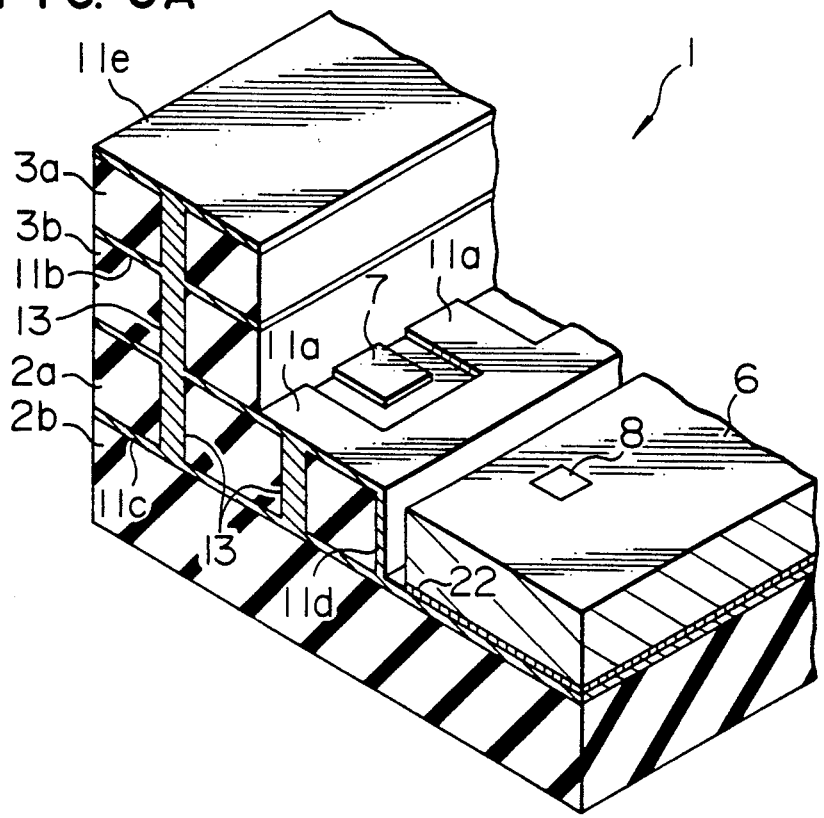
FIGS. 5A to 5C are sectional views showing stepwise the fabrication steps of a packaged semiconductor integrated circuit device in accordance with still another embodiment of the present invention.
Figure 5B:
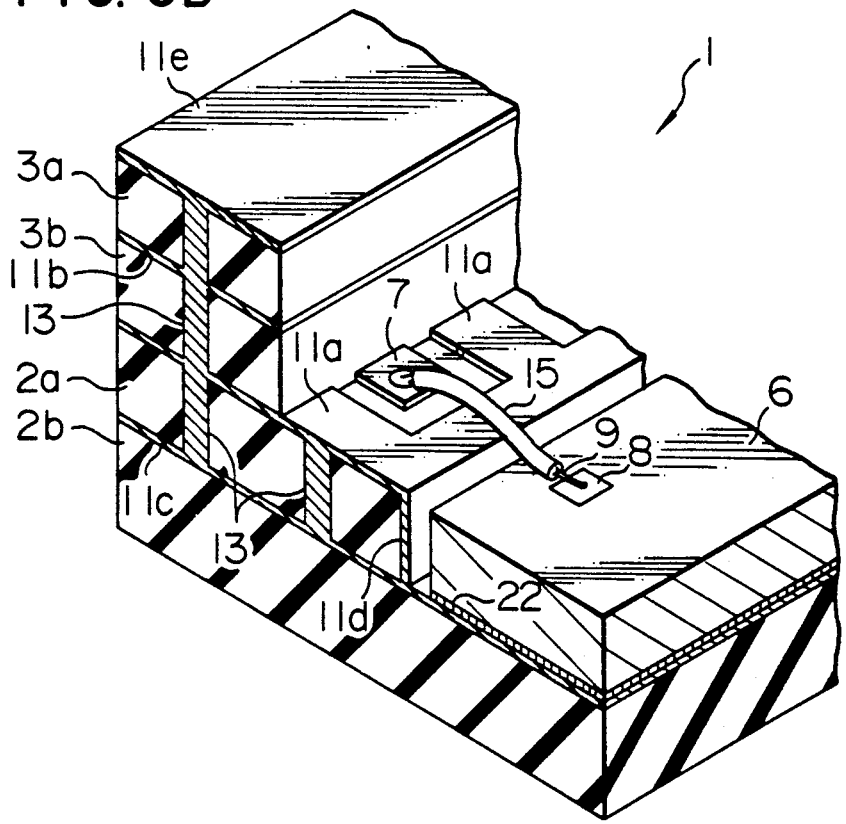

In the structures obtained through the same steps shown in FIGS. 3A through 3H, the IC chip 6 is die-bonded onto the first reference potential conductor pattern (first metallized layer) 11c inside the space 5 using an Au - 20%Sn brazing material 22, for example (FIG. 5A).

Next, a coated connection conductor (coated bonding wire) such as an Au wire connection conductor 9 coated with a dielectric material member 15 such as polyethylene is provided in such a manner as to step over the second reference potential conductor pattern (second metallized layer) 11a, so that the bonding pad 8 and the strip conductor 7 are connected electrically with each other by the conductor 9. In this instance, the loop (shape) of the bonding wire 9 is adjusted so that the coated dielectric material member 15 of the coated bonding wire comes into contact with the second metallized layer 11a and by so doing, the conductor wire 9 of the coated bonding wire and the second metallized layer 11a positioned below the conductor wire 9 are disposed in such a manner as to oppose each other with a predetermined spacing between them through the dielectric material 15 of the coated bonding wire (FIG. 5B).

Figure 5C:
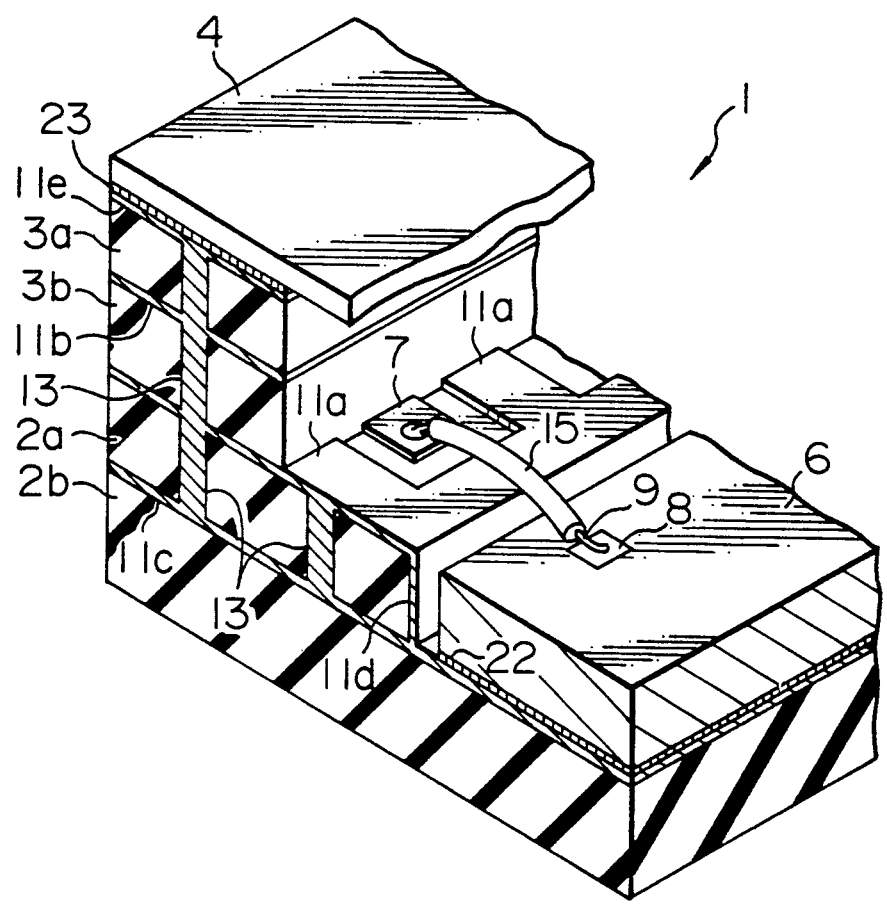

The cap 4 made of the 42-alloy (Fe - 42%Ni), for example, is bonded to the metallized layer 11e using the Au - 20%Sn brazing material 23, for example (FIG. 5C).

Figure 5D:
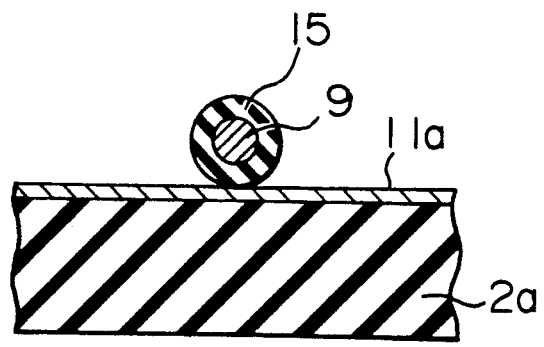
FIG. 5D is an explanatory view useful for explaining a characteristic impedance of a connection conductor in the semiconductor integrated device shown in FIG. 5C.

The arrangement of the coated bonding wires (9, 15) and the members surrounding them in the embodiment shown in FIG. 5C is shown in section in FIG. 5D, and a capacitor C for offsetting inductance L of the conductor wire 9 is formed between the bonding wire 9 and the second metallized layer 11a. Therefore, the characteristic impedance Zo' of the bonding wire 9 can be approximated by the following formula:

$$Zo' = \sqrt{\frac{L}{C}} \quad (2)$$

Accordingly, it can be understood that the characteristic impedance Zo' of the bonding wire 9 can be set to a desired value.

Next, the packaged semiconductor IC device in accordance with still another embodiment of the present invention and its fabrication process will be explained with reference to FIGS. 6A-6M, 6H', 6J', 6L' and 6M'.

Figure 6A:
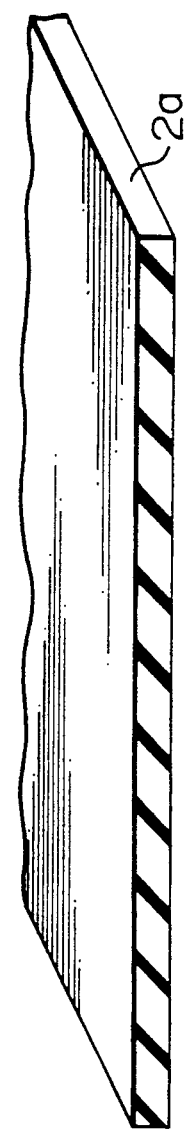
Figure 6B:
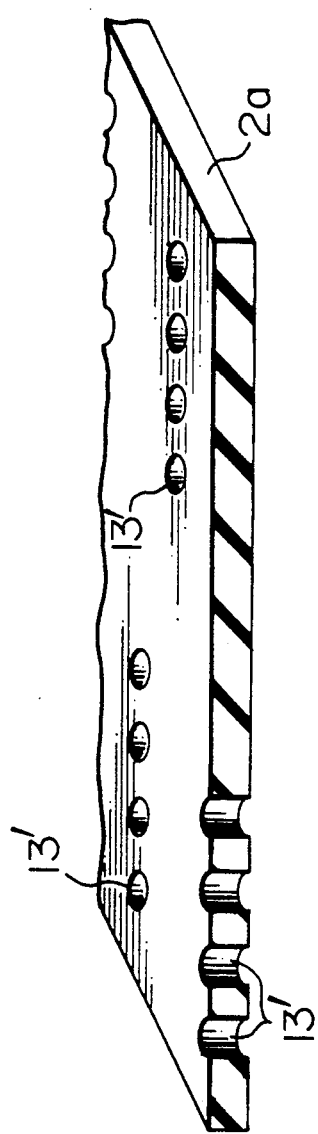
Figure 6C:
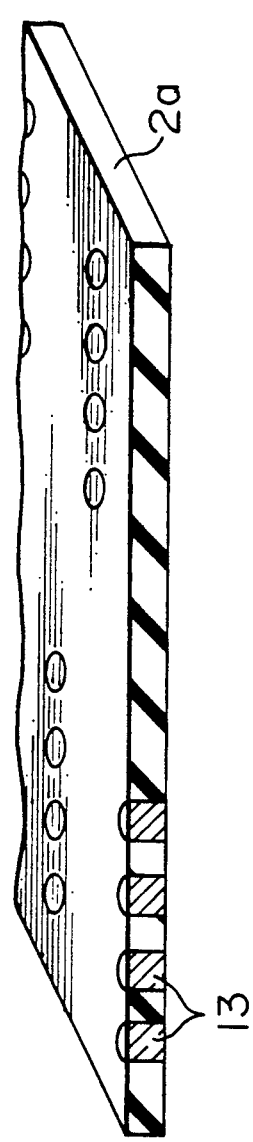

Through-holes 13' are bored by punching at predetermined positions of an unbaked ceramic sheet 2a shown in FIG. 6A' (FIG. 6B). Metallization ink such as tungsten ink are charged by screen printing into these through-holes 13' using a screen printing mask having through-holes therein that correspond to these through-holes 13', forming thereby electrically conductive through-holes or through hole conductors 13 (FIG. 6C).

Next, a plurality of strip conductors 7 and a plurality of substantially U-shaped second reference potential conductor patterns (second metallized layers) 11a are formed by the similar printing method. At this time, one electrically conductive through hole conductor 13 is positioned at each corner of the U-shaped second metallized layer 11a (FIG. 6D).

Ink that is charged into the through-hole at each corner of the U-shaped second metallized layer 11a is sucked therefrom by vacuum suction in such a manner as to leave ink on the inner wall of the hole and a side surface metallized layer or in other words, an interconnecting conductor 11d', is formed (FIG. 6E).

Next, the unbaked ceramic sheet 2a on which the strip conductors 7, the second metallized layer 11a and the interconnecting conductor 11d' are thus formed is cut in such a manner as to split the interconnecting conductor 11d in registration with the inner end surfaces of the U-shaped metallized layers 11a, and two structures are thus obtained. Both structures are positioned after a space corresponding to the space 5 for accommodating the IC chip 6 is set between both structures (FIG. 6F).

Figure 6G:
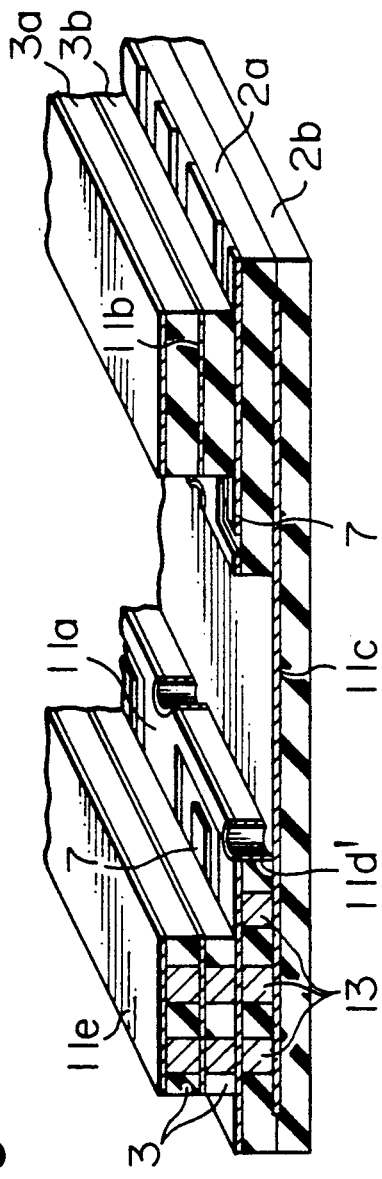

Next, the base plate 2a and the frame member 3b each having a plurality of through-holes and a plurality of metallized layers (11c, 11b, 11e) that are formed on an unbaked ceramic sheet by the similar process and part 3a of the cap structure are laminated as shown in FIG. 6G and the resulting laminate structure is baked (FIG. 6G).

Figure 6H:
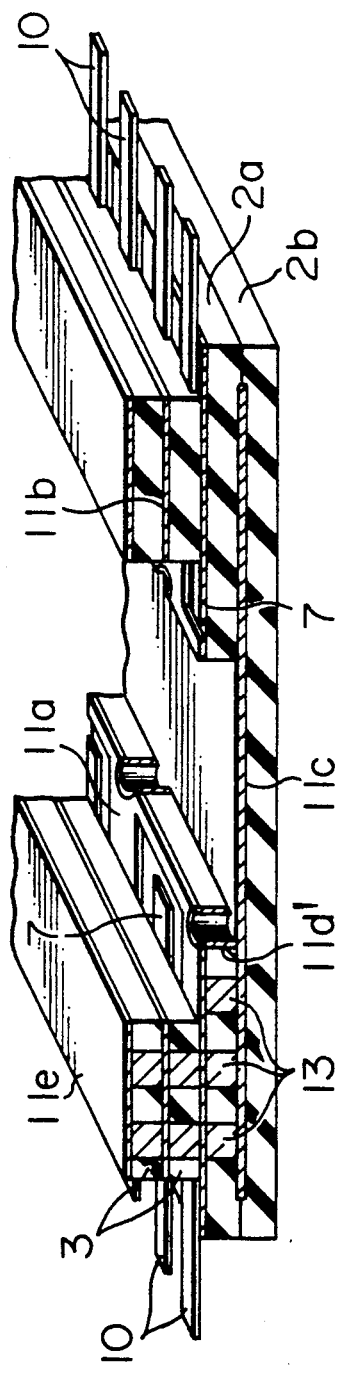

Foundation plating such as electroplating of Ni, for example, is applied to the surface of each of the exposed metallized layers and the external lead 10 (e.g. made of 42-alloy) is fused to the strip conductors 7 and to the metallized layers using a brazing material such as a silver solder. Furthermore, finish plating is applied to the exposed portions of the metallized layers and to the external leads 10 using Au plating, for example (FIG. 6H). Part of the device at this fabrication stage is shown in enlargement in FIG. 6H'.

Figure 6I:
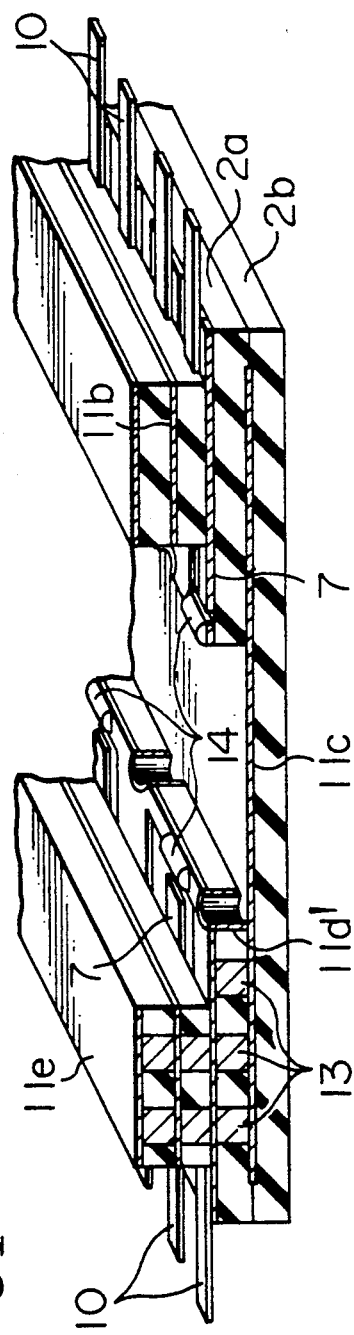

To form the dielectric material member 14, a polyimide resin, for example, is coated or potted onto the portions of the U-shaped metallized layer 11a exposed to the space and is then shaped in a desired shape (FIG. 6I).

Figure 6J:
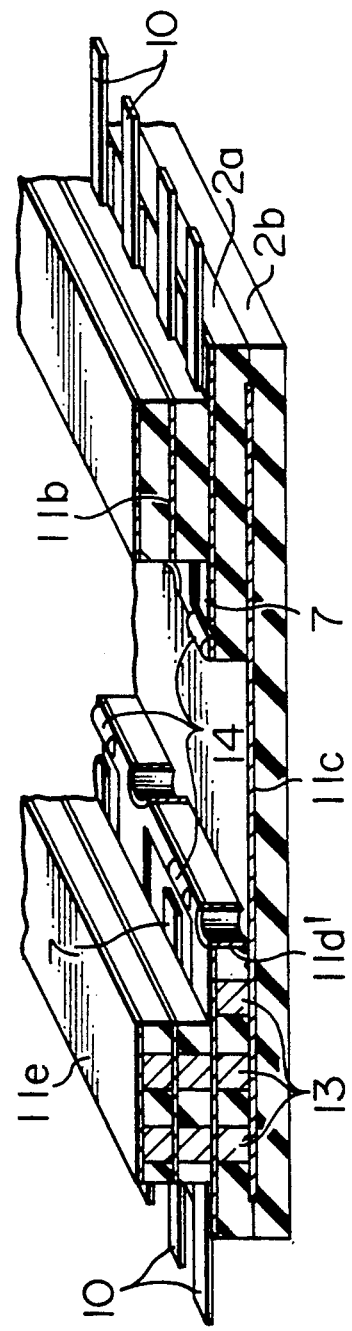

If the dielectric material member 14 is an uncured resin such as a varnish, it is baked, cured and shaped (FIG. 6J). Part of the device at this fabrication stage is shown in enlargement in FIG. 6J'.

Figure 6K:
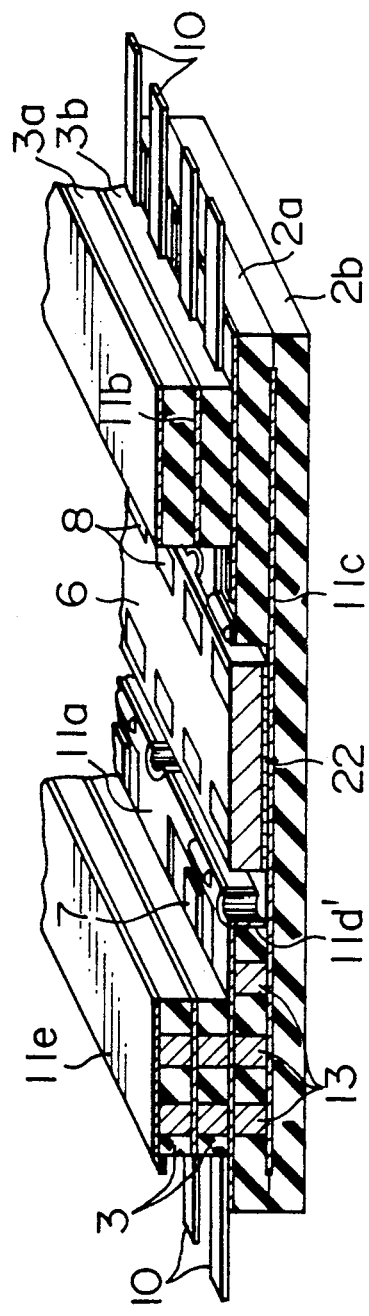

Next, the IC chip 6 is die-bonded onto the metallized layer 11c inside the space 5 using the Au -20%Sn brazing material 22, for example (FIG. 6K).

Figure 6L:
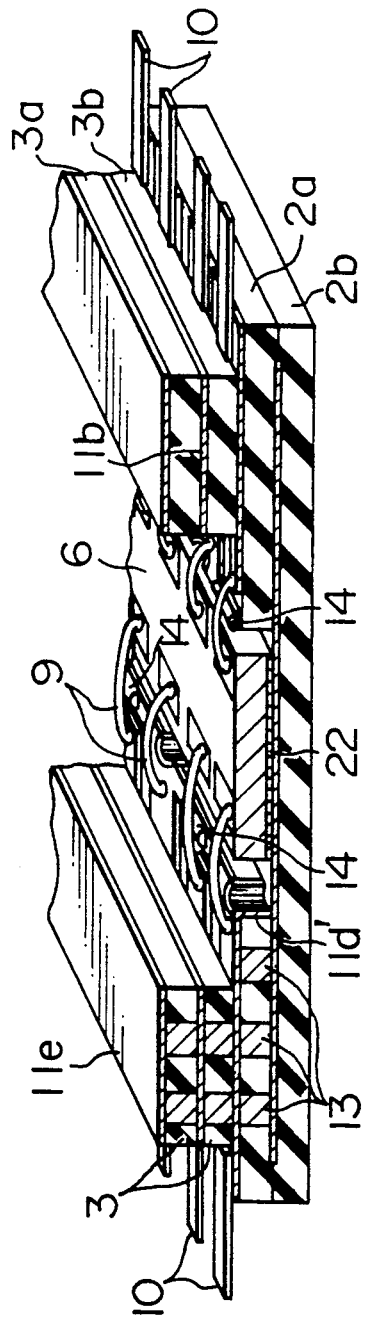

A connection conductor (bonding wire) 9 of the Au wire, for example is provided in such a manner as to step over the dielectric material member 14, so that the bonding pad 9 and the strip conductor 7 are connected electrically with each other by the conductor 9. In this instance, the loop (shape) of the bonding wire 9 is adjusted so that the bonding wire 9 and the dielectric material member 14 come into contact with each other. Connection between the bonding pad 8 which provides the reference potential and the reference potential conductor pattern (second metallized layer) 11a is effected using also the bonding wire of the Au wire but the dielectric material member is not provided to these bonding wires (FIG. 6L). Part of the device at this fabrication stage is shown in enlargement in FIG. 6L'.

Figure 6M:
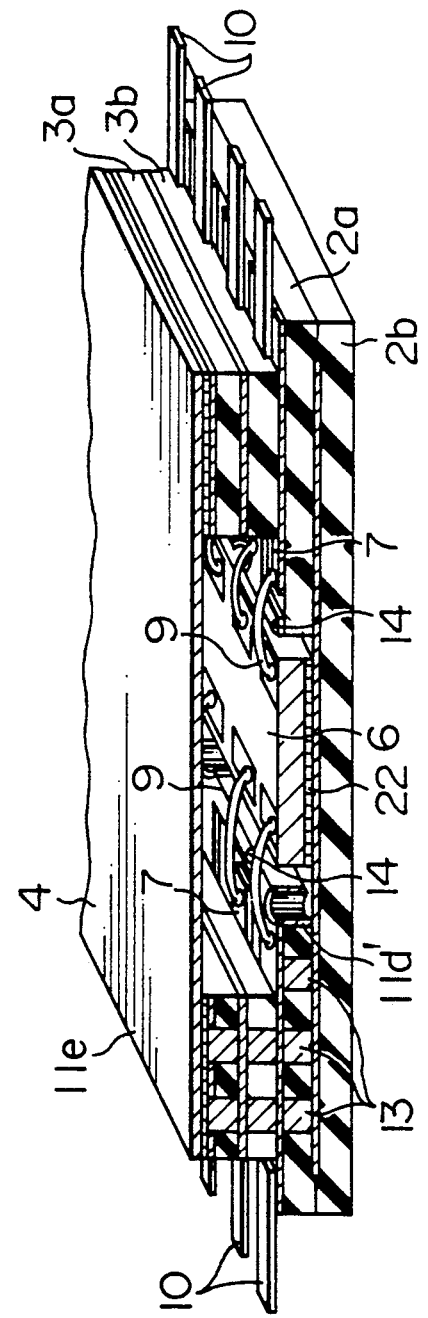
Figure 6H:
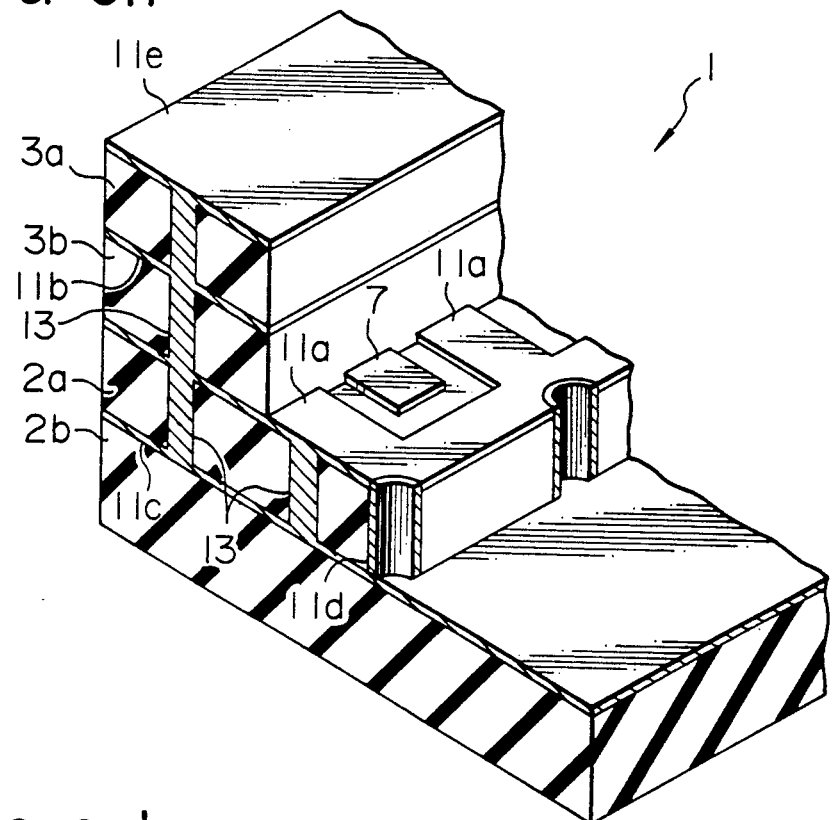
Figure 6J:
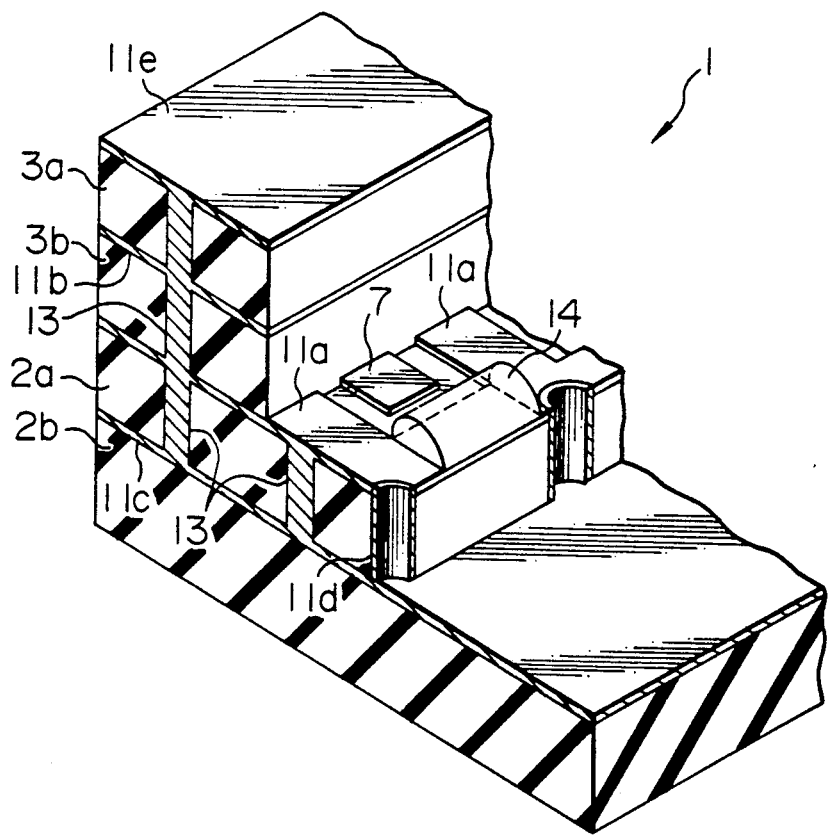
Figure 6L:
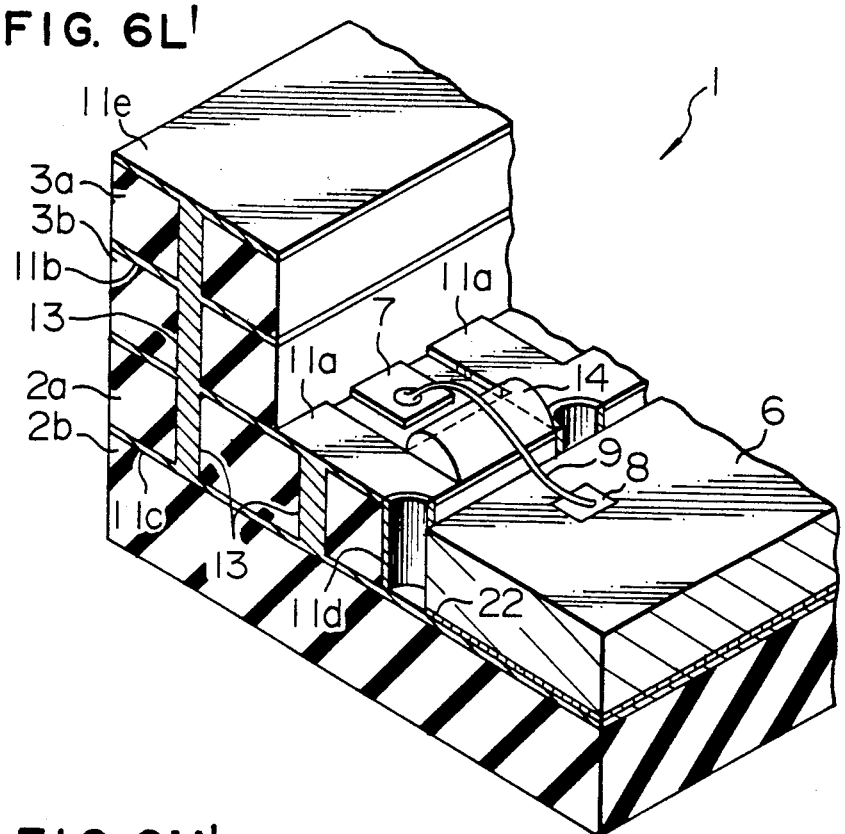
Figure 6M:
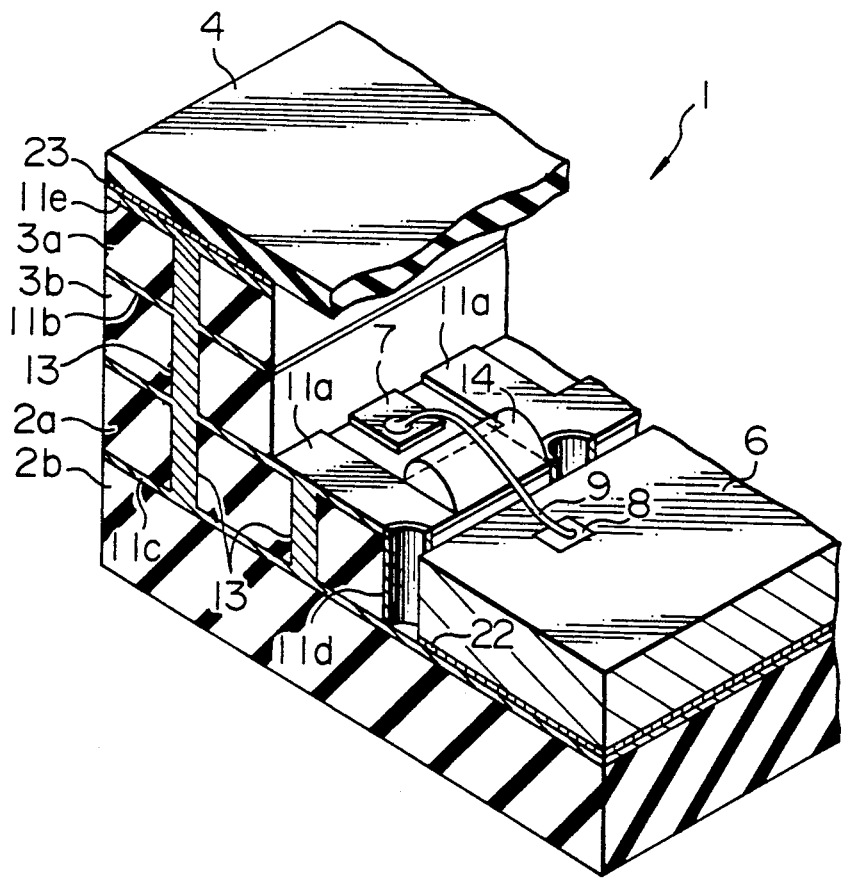

Next, the cap 4 made of the 42-alloy (Fe -42%Ni), for example, is bonded to the metallized layer 11e using the Au - 20%Sn brazing material 23, for example (FIG. 6M). Part of the completed device is shown in enlargement in FIG. 6M'.

Although the present invention completed by the present inventor has thus been explained definitely with some preferred embodiments thereof, the invention is not particularly limited to these embodiments but can of course be changed or modified in various manners without departing from the scope thereof.

The dielectric material member interposed between the bonding wire 9 and the second metallized layer 11a may be those materials which have a dielectric property, and is not particularly limited to the resin.

We claim:

1. A package for a semiconductor IC chip, comprising;
  a base plate having a plane for supporting said IC chip;
  a first reference potential conductor pattern formed on said base plate and serving to provide a reference potential for said IC chip;
  a support plate of a first dielectric material formed to partly cover said base plate and said first reference potential conductor pattern and having a side surface contributing to definition of a space for said IC chip on said base plate;
  a strip conductor formed on said support plate and serving to carry a signal to be coupled to said IC chip;
  a second reference potential conductor pattern formed on said support plate and extending in a juxtaposed relation with said strip conductor to sandwich said strip conductor in a spaced relationship therewith on said support plate and to reach said side surface of said support plate;
  an interconnecting conductor formed on said side surface of said support plate which electrically interconnects said first and second reference potential conductor patterns;
  a frame member of a second dielectric material formed to partly cover said support plate, said second reference potential conductor pattern and said strip conductor and contributing to definition of said space for said IC chip;
  a third reference potential conductor pattern formed on said frame member, said first and third reference potential conductor patterns being arranged such that said strip conductor is sandwiched by said first and third reference conductor patterns in a direction normal to a major plane of said support plate whereby said first, second and third reference conductor patterns surround said strip conductor with the dielectric materials of said support plate and said frame member being interposed therebetween to provide said strip conductor with a characteristic impedance matched with an impedance of a source of said signal; and
  a cap structure formed on said frame member and said third reference potential conductor pattern and extending over said base plate to define said space for said IC chip along with said base plate, said support plate and said frame member.

2. A package for a semiconductor IC chip according to claim 1, in which said first and second dielectric materials are the same.

3. A package for a semiconductor IC chip according to claim 2, in which both of said first and second dielectric materials are alumina.

4. A packaged semiconductor IC device comprising:
  a package of a dielectric material having a space therein;
  a semiconductor IC chip placed in said space;
  a strip conductor buried in said package for carrying a signal to be coupled to said semiconductor IC chip, said strip conductor having a first end exposed to said space for said semiconductor IC chip to be opposed thereto and a second end for connection with an external lead;
  first and third reference potential conductors buried in said package for sandwiching said strip conductor as viewed in a thicknesswise direction of said semiconductor IC chip;
  a second reference potential conductor of a substantially U-shaped pattern buried in said package so as to be substantially coplaner with said strip conductor for sandwiching said strip conductor as viewed in a direction perpendicular to said thicknesswise direction of said semiconductor IC chip such that said first end of said strip conductor is surrounded by said second reference potential conductor;
  a connection conductor extending across said second reference potential conductor in said space such that said first and second ends of said connection conductor are connected with said first end of said strip conductor and said semiconductor IC chip, respectively; and
  a dielectric material member provided at least between said connection conductor and said second reference potential conductor for providing said connection conductor with a characteristic impedance matched with an impedance of a source of said signal.

5. A packaged semiconductor IC device according to claim 4, in which said dielectric material member is in contact with said connection conductor and with said second reference potential conductor.

6. A packaged semiconductor IC device according to claim 5, in which said connection conductor is a bonding wire.

7. A packaged semiconductor IC device according to claim 4, in which said dielectric material member is disposed such that a portion of said connection conductor is buried in said dielectric material member.

8. A packaged semiconductor IC device according to claim 4, in which said dielectric material member is disposed such that at least a portion of said connection conductor is covered with said dielectric material member.

9. A packaged semiconductor IC device, comprising:
a base plate;
a semiconductor IC chip supported on said base plate;
a first reference potential conductor pattern formed on said base plate and serving to provide a reference potential for said IC chip;
a support plate of a first dielectric material formed to partly cover said base plate and said first reference potential conductor pattern and having a side surface contributing to definition of a space for said IC chip on said base plate;
a strip conductor formed on said support plate and serving to carry a signal to be coupled to said IC chip, said strip conductor having a first end opposed to said IC chip and a second end for connection with an external lead;
a second reference potential conductor pattern formed on said support plate and extending substantially in a U-shape to sandwich said strip conductor, to be insulated from said strip conductor and to extend to reach said side surface on said support plate such that said first end of said strip conductor is surrounded by said second reference potential conductor;
a connection conductor extending across said second reference potential conductor in said space such that first and second ends of said connection conductor are connected with said first end of said strip conductor and said semiconductor IC chip, respectively;
a dielectric material member provided at least between said connection conductor and second reference potential conductor for providing said connection conductor with a characteristic impedance matched with an impedance of a source of said signal;
an interconnecting conductor formed on said side surface of said support plate so as to electrically interconnect said first and second reference potential conductor patterns with each other;
a frame member of a second dielectric material formed to partly cover said support plate, said second reference potential conductor pattern and said strip conductor and contributing to definition of said space for said IC chip;
a third reference potential conductor pattern formed on said frame member, said first and third reference potential conductor pattern being arranged such that said strip conductor is sandwiched by said first and third reference conductor patterns as viewed in a thicknesswise direction of said support plate, whereby said first, second and third reference conductor patterns surround said strip conductor with the dielectric materials of said support plate and said frame member being interposed therebetween to provide said strip conductor with a characteristic impedance matched with an impedance of a source of said signal; and
a cap structure formed on said frame member and said third reference potential conductor pattern and extending over said base plate to define said space for said IC chip along with said base plate, said support plate and said frame member.

10. A packaged semiconductor IC device comprising:
a package of a dielectric material having a space therein;
a semiconductor IC chip placed in said space;
a strip conductor buried in said package for carrying a signal to be coupled to said semiconductor IC chip, said strip conductor having a first end exposed to said space at a position opposed to said semiconductor IC chip and a second end for connection with an external lead;
a reference potential conductor buried in said package;
a connection conductor extending across said reference potential conductor in said space such that first and second ends of said connection conductor are connected with said first end of said strip conductor and said semiconductor IC chip, respectively; and
a dielectric material member provided at least between said connection conductor and said reference potential conductor for providing said connection conductor with a characteristic impedance matched with an impedance of a source of said signal.

* * * * *